(12) United States Patent
Shen et al.

(10) Patent No.: US 8,589,095 B2
(45) Date of Patent: Nov. 19, 2013

(54) POWER MEASURING DEVICE

(75) Inventors: Fu Chin Shen, Taipei (TW); Kuo-Feng Kao, New Taipei (TW)

(73) Assignee: Aten International Co., Ltd., Shijr (TW)

( * ) Notice: Subject to any disclaimer, the term of this patent is extended or adjusted under 35 U.S.C. 154(b) by 374 days.

(21) Appl. No.: 13/089,629

(22) Filed: Apr. 19, 2011

(65) Prior Publication Data

US 2011/0270547 A1   Nov. 3, 2011

(30) Foreign Application Priority Data

May 3, 2010 (TW) .............................. 99114118 A

(51) Int. Cl.
*G01R 21/06* (2006.01)
*G01R 15/00* (2006.01)

(52) U.S. Cl.
USPC .............................................. 702/60; 702/62

(58) Field of Classification Search
USPC ......... 702/57, 60, 61, 62, 64, 65, 66, 67, 107; 324/140 R, 141, 142; 340/12.32, 340/870.02; 370/236, 419; 375/222
See application file for complete search history.

(56) References Cited

U.S. PATENT DOCUMENTS 5,673,196 A    9/1997  Hoffman et al.
7,043,380 B2 *  5/2006  Rodenberg et al. ............. 702/62

FOREIGN PATENT DOCUMENTS

TW           357268    5/1999
TW        200702670    1/2007
TW          M348394    1/2009

* cited by examiner

*Primary Examiner* — John H Le
(74) *Attorney, Agent, or Firm* — Chen Yoshimura LLP

(57) ABSTRACT

A power measuring device includes an induced current meter and a power consumption indicator. The induced current meter measures and outputs a first current information of a power circuit or a second current information of a main power circuit. A voltage information of one of the branching power circuits is measured by the power consumption indicator, and the power consumption indicator receives the first or the second current information from the induced current meter. A first information is calculated according to the first current information and the voltage information, a second information is calculated according to the second current information and the voltage information, and both of the current information is displayed by the indicator. The first current information and the voltage information are obtained by the induced current meter and the indicator respectively and synchronously. The second current information and the voltage information are obtained by the induced current meter and the indicator respectively and synchronously.

20 Claims, 6 Drawing Sheets

POWER MEASURING DEVICE

BACKGROUND OF THE INVENTION

1. Field of the Invention

This invention relates to power measuring devices, and in particular, it relates to a arbitrarily installable household power measuring device.

2. Description of the Related Art

With the research, development and wide spread use of electrical products, power sources becomes an indispensable resource of modern development and everyday life. Modern people need power supply whenever and wherever they enjoy the convenience of living from the use of electrical products. Also developed as a result is the calculation and measurement of power consumption data, which are used by power suppliers as a pricing basis, or used for monitoring power consumption cared by the consumers, or even used to help energy conservation.

However, although power measuring devices have been long developed, most conventional power measuring devices, whether digital or analogue, with or without online capacity, such as the three-phase meter shown in Taiwan Patent No. TW357268, have one common shortcoming, .i.e., they can only be installed at the line side of a power source, such that it is unavoidable to cut and slice electrical wires when the measuring devices are installed for measuring power source data, which requires installation technicians with related knowledge and ability to perform the installation and construction. Since the installation and use of such power measuring devices are not consumer-friendly, their maintenance is also inconvenient. In addition, the traditional structure of the conventional power measuring devices always combines the current measuring unit and the voltage measuring unit together, which further limits their installation and use.

A household power consumption display device with an extending cord is shown in Taiwan Patent No. 200 702 670, which can be plugged to a household wall outlet or socket so it is easy to install. However, it can only measure the power consumption from that wall outlet, and cannot measure power consumption from other electrical wiring branches upstream to the wall outlet. Therefore, while the extending cord may be relocated to another wall outlet, its application range is still limited.

Therefore, the applicant, after careful testing and research with a spirit of perseverance, has invented a new power measuring device, as to be described below.

SUMMARY OF THE INVENTION

The present invention provides a power measuring device. The different units of the device, such as an induced current meter and a power consumption indicator, can be separately installed at different locations of an electrical power circuit, and utilize wireless communication signal synchronization and correction technology to exchange the measured electrical characteristic as voltage or current data information to achieve the functions of a general household digital or analog power meter, such that it is much easier for the installation and maintenance of the device. When multiple induced current meters are installed at any branches of the same electrical power circuit, the power consumption data of all such branches in the power circuit can be measured and displayed through the time-division multiplexing (TDM) technology. Because the induced current meters measure power consumption through electrical induction, there is no need to demolish any wall surface or cut and slice electrical wires to install the induced current meters, and the power consumption indicator can be plugged into any wall outlet or socket. Therefore, a consumer can install the present invention device without demolishing walls, cutting and slicing wires or other professional skills, which overcomes the drawback of conventional power measuring devices which are hard for the users to install and maintain. In addition, since the induced current meters and the power consumption indicator can be separately installed at different locations, the power consumption indicator can be located within the view or sight of the consumer as much as possible so that the consumer can easily read the measurement data. Furthermore, the present invention device draws power from the electrical power circuit to be measured, so that there is no need for the user to provide or replace its power source.

According to one exemplary embodiment of the present invention, a power measuring device is provided for a power supply circuit, where the power supply circuit includes a main circuit and multiple branch circuits, and the main circuit is electrically connected to the parallel branch circuits. The power measuring device includes: an induced current meter installed at one of the branch circuits to be measured or the main circuit for measuring a first current data of the branch circuit or a second current data of the main circuit, and a power consumption indicator electrically connected in parallel to one of the branch circuit for measuring voltage data of the branch circuit and also communicating with the induced current meter to receive the first or second current data, and further calculating a first power consumption data based on the first current data and the voltage data or a second power consumption data based on the second current data and the voltage data and displaying the first or second power consumption data, where the induced current meter and the power consumption indicator are separately installed but synchronously begin measuring the first current data and the voltage data or the second current data and the voltage data.

According to another exemplary embodiment of the present invention, a power measuring device is provided for a power supply circuit. The power measuring device includes: a first electrical characteristic measuring unit installed at one of the branch circuits or the main circuit upstream to the one branch circuit for measuring through electrical induction a first electrical characteristic data of the branch circuit or the main circuit and outputting the first electrical characteristic data, and a second electrical characteristic measuring unit installed on a wall outlet which is connected in parallel to the one branch circuit for measuring a second electrical characteristic data of the one branch circuit and also communicating with the first electrical characteristic measuring unit to receive the first electrical characteristic data, and further calculating a power consumption data based on the first electrical characteristic data and the second electrical characteristic data, wherein the first electrical characteristic measuring unit and the second electrical characteristic measuring unit are separately installed but synchronously begin measuring the first electrical characteristic data and the second electrical characteristic data.

To make the above described invention easier to understand, a preferred embodiment is described below in detail, in conjunction with the appended drawings.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

It is to be understood that both the foregoing general description and the following detailed description are exemplary and explanatory and are intended to provide further explanation of the invention as claimed.

DETAILED DESCRIPTION OF THE PREFERRED EMBODIMENTS

As required, a detailed illustrative embodiment of the present invention is disclosed herein. However, techniques, systems and operating structures in accordance with the present invention may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein, which define the scope of the present invention. The following presents a detailed description of the preferred embodiment (as well as some alternative embodiments) of the present invention.

Figure 1:
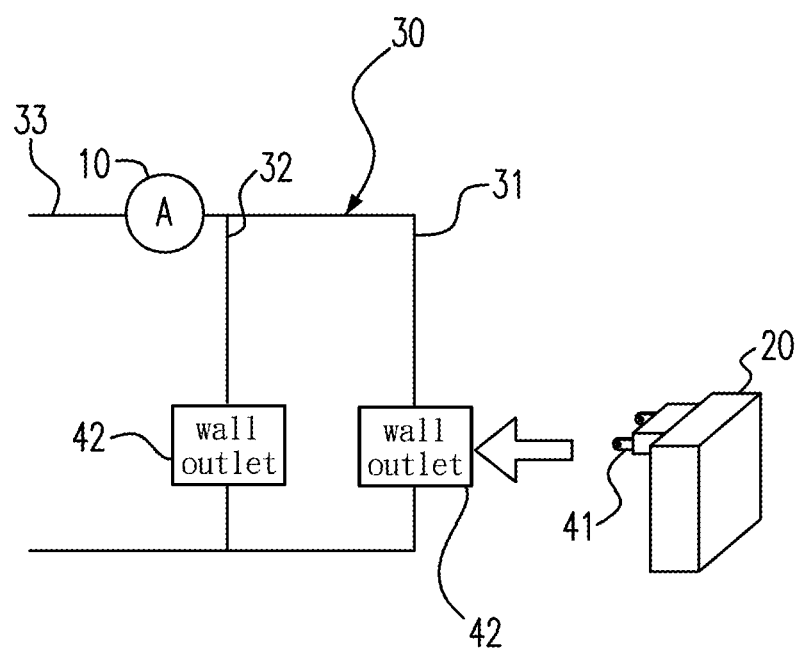
FIG. 1 is a block diagram illustrating a first preferred embodiment of the power measuring device of the present invention.

Referring to FIG. 1, there is shown a block diagram illustrating a first preferred embodiment of the power measuring device of the present invention. The power measuring device includes a first electrical characteristic measuring unit such as an induced current meter 10 and a second electrical characteristic measuring unit such as a power consumption indicator 20. Induced current meter 10 may be a clip-on type current meter or other current meters that do not require demolition of wall boards or cutting or slicing of electrical wires. Also shown in FIG. 1 is an electrical circuit 30 applicable to the present invention. The electrical circuit 30 includes a main circuit 33 and multiple branch circuits 31, 32. The main circuit 33 is electrically connected to the branch circuits 31, 32 and is upstream to the branch circuits 31, 32. The branch circuits have respective wall outlets or sockets 42 to provide power. For example, the electrical circuit 30 is preferably a household power supply circuit, the main circuit 33 is the main power supply circuit of the household where the branch circuits 31, 32 are its branch circuits, and the wall outlets are the typical 100 or 110 Volt household wall outlet. In this embodiment, the induced current meter 10 may be installed at the location wherein measurement is needed without removal of wall plate or wall panels and without cutting or slicing electrical wires by using a clip-on or clamp-on technique. As the example shown in FIG. 1, in order to measure the power consumption of main circuit 33, the induced current for 10 is installed at the main power circuit 33 and measures the electrical characteristic such as current data (such as current values, etc.) of the main circuit 33 by electrical induction. The power consumption indicator 20 has plugs 41 so it can be plugged into the wall outlet 42 so that the power consumption indicator 20 is electrically connected in parallel with one of the branch circuits 31, 32 and measures the voltage data (such as voltage values, etc.) of the wall outlet or the branch circuits 31, 32. The power consumption indicator 20 and the induced current meter 10 can communicate through various means of communication, preferably through wireless technologies, such as via Bluetooth, ZigBee, and IEEE 802.11 series wireless technologies or modules, to exchange measured voltage and current data for calculating the power consumption data.

Figure 2:
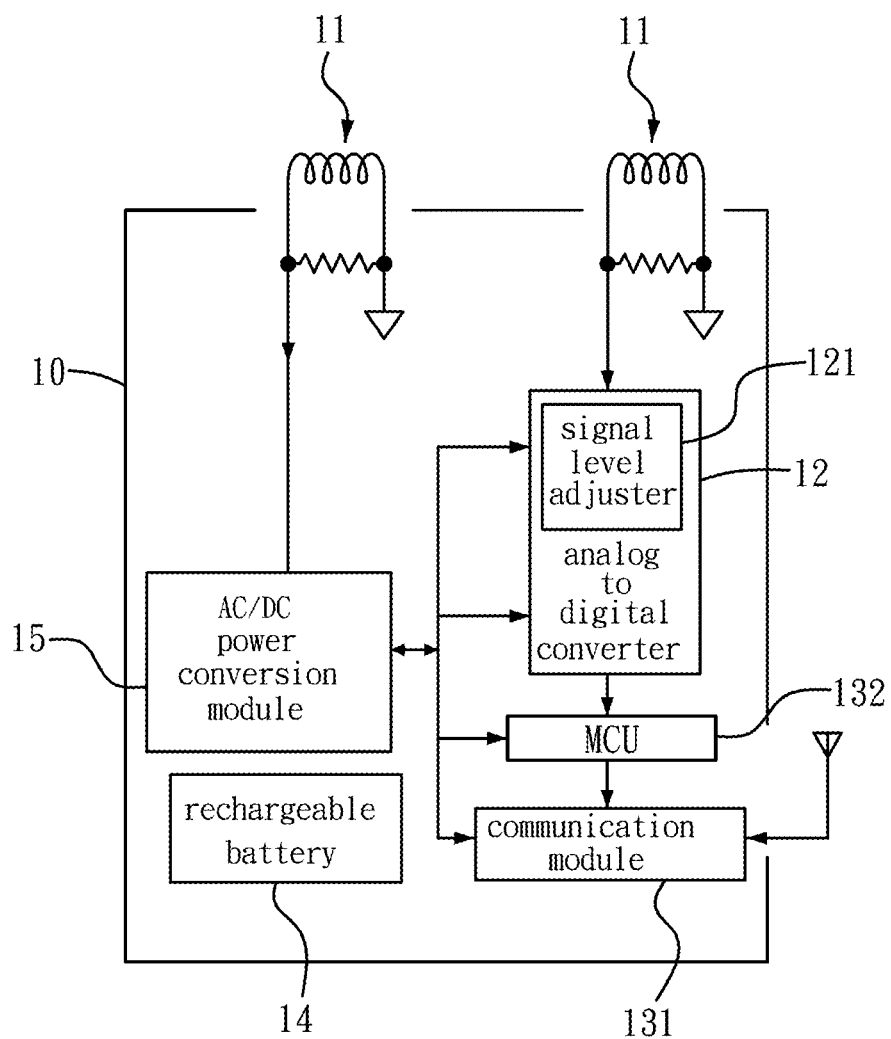
FIG. 2 is a block diagram illustrating the internal configuration of the induced current meter 10.

Referring to FIG. 2, there is a block diagram illustrating the internal configuration of the induced current meter 10. Induced current meter 10 includes induction coils 11, an analog to digital converter 12, a communication module 131, a micro controller unit (MCU) 132, a rechargeable battery 14, and an alternate current (AC) to direct current (DC) (AC/DC) power conversion module 15, where the analog to digital converter 12 includes a signal level adjustor 121. The induction coils 11 are electrically connected to the AC/DC power conversion module 15 and the analog to digital converter 12, and the AC/DC power conversion module 15 is electrically connected to the analog to digital converter 12, the signal level adjuster 121, the communication module 131 and the MCU 132. The analog to digital converter 12, the communication module 131 and the MCU 132 are electrically connected to each other, where the MCU 132 can be used to control the communication module 131. According to the principle of electromagnetic induction, induction coils 11 produces an induced current through induction, which induced current can be used as the basis of measuring current data. The AC/DC power conversion module 15 converts the induced current into direct current to provide power to induced current meter 10 and supplies power to the analog to digital converter 12, the communication module 131 and the MCU 132. In addition, the rechargeable battery 14 may also be used to provide power to the induced current meter 10. Alternatively both the induced current and the rechargeable battery 14 are used to provide power to the induced current meter 10. When the analog to digital converter 12 receives the direct current, the signal level adjustor 121 makes appropriate adjustment of the signal level so that the analog to digital converter 12 can perform subsequent sampling and quantization to digitize the current data. The communication module 131 can send and receive signals and outputs the digitized current data. The communication module 131 can support various communication protocols and specifications, preferably the Bluetooth, ZigBee, or IEEE 802.11 series of wireless communication technologies or specifications. It is understood by the ordinary skilled in the art of the present invention that the two induction coils 11 shown in FIG. 2 can be replaced by a single coil 11 for supplying current as well as obtaining current data.

Figure 3:
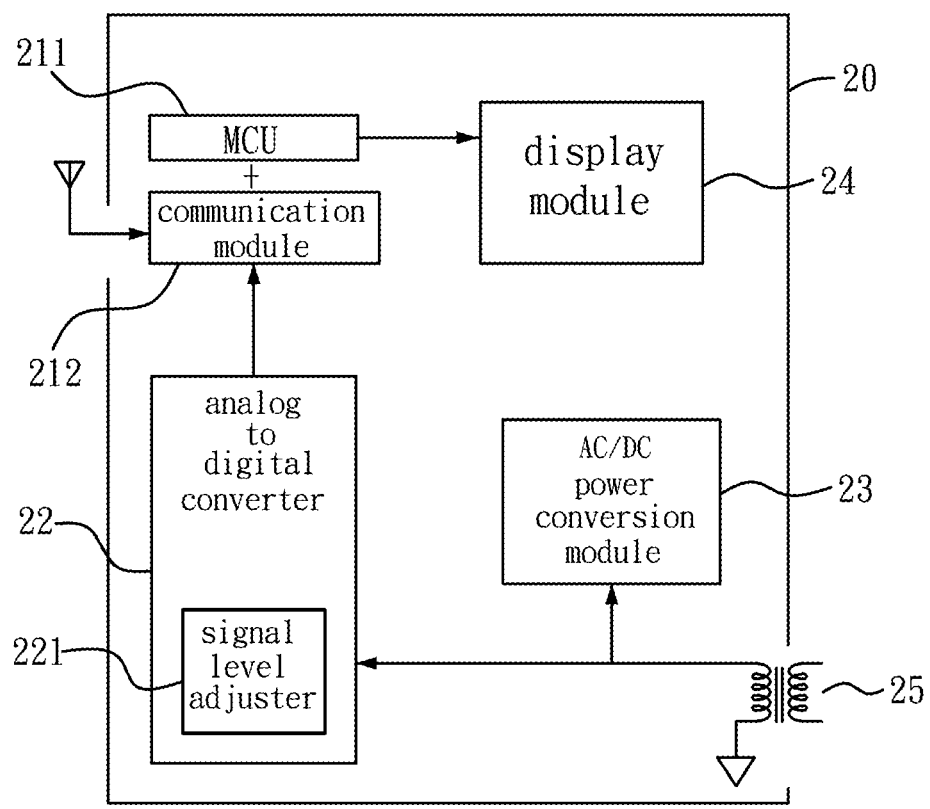
FIG. 3 is a block diagram illustrating the internal configuration of the power consumption indicator 20.

Referring to FIG. 3, there is a block diagram illustrating the internal configuration of the power consumption indicator 20. The power consumption indicator 20 includes an MCU 211, a communication module 212, an analog to digital converter 22, an AC/DC power conversion module 23, a display module 24 and an induction coil 25, wherein the analog to digital converter 22 has a signal level adjuster 221. The induction coil 25 is electrically coupled to the wall outlet 42 shown in FIG. 1. Induction coil 25 is electrically connected to the AC/DC power conversion module 23 and the analog to digital converter 22. The analog to digital converter 22 is electrically connected to the MCU 211 and communication module 212. The MCU 211 and communication module 212 are electrically connected to the display module 24, where the MCU 211 can be used to control the communication module 212. Induction coil 25 obtains an induced current or voltage through as a basis for measuring the voltage data and power supply data. The current or voltage obtained by the induction coil is converted by the AC/DC power conversion module 23 into DC power supply to provide power to the power consumption indicator 20. In addition, the voltage data is appropriately adjusted by the signal level adjustor 221 of the analog to digital converter 22, so that the analog to digital converter 22 can perform subsequent sampling and quantization to digitize the voltage data. The communication module 212 can send and receive signals and receive the digitized current data output from the induced current meter 10. When the power consumption indicator 20 receives the digitized current data, the MCU 211 can calculate power consumption data based on the digital voltage data and the digitized current data, such as at least one of the instant power, active power, reactive power, phase of current, current, voltage or any combination thereof. The calculated result can be displayed through the display module 24.

Figure 4:
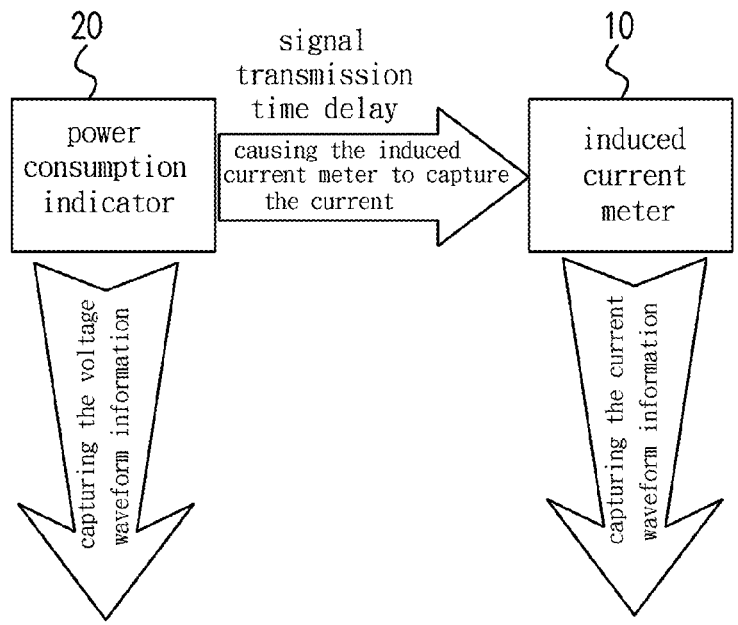
FIG. 4 is a diagram illustrating the signal time delay between the induced current meter 10 and the power consumption indicator 20 when they are communicating wirelessly.

Referring to FIG. 4, when induced current meter 10 and the power consumption indicator 20 are communicating wirelessly, there is a signal transmission time delay between the two devices. When the power consumption indicator 20 starts to measure the voltage data by capturing the voltage waveform information, and transmits a signal to cause the induced current meter 10 to start measuring the current data by capturing the current waveform information, the induced current meter 10 and the power consumption indicator 20 can not start at the same time due to the signal transmission time delay, making the phase relationship between the captured voltage and current meaningless. Therefore, before the measurement of the electrical properties or power consumption, the induced current meter 10 and the power consumption indicator 20 must be synchronized to correct and compensate the signal time delay, so that the induced current meter 10 and the power consumption indicator 20 can capture and measure the electrical properties synchronously in order to obtain the correct phase.

Figure 5:
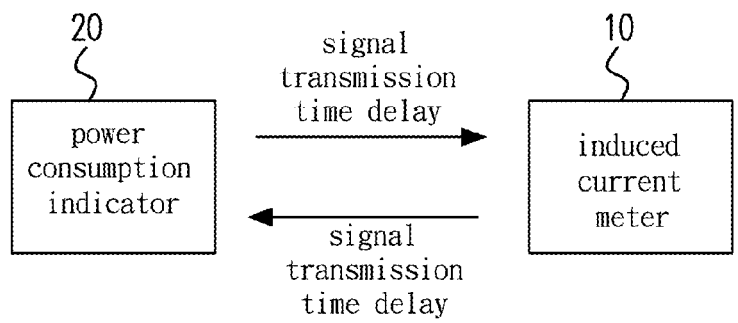
FIG. 5 is a diagram illustrating the synchronization and correction of the time delay.

Referring to FIG. 5, the concept of synchronization and correction is introduced to compensate the time delay between the induced current meter 10 and the power consumption indicator 20. Preferably this is done by using a timer to calculate the time delay between the induced current meter 10 and the power consumption indicator 20 so that it can be compensated. The preferred steps of synchronization and correction are as follows:

1. Sending a correction signal from the power consumption indicator 20 to the induced current meter 10, and recording a "sent time";

2. At the same time when the induced current meter 10 receives the correction signal, sending a confirmation signal from the induced current meter 10 to the power consumption indicator 20, and recording a "reply time" when the power consumption indicator 20 receives the confirmation signal from the induced current meter 10;

3. Calculating the time difference between the "reply time" and the "sent time" by the MCU 211 of the power consump tion indicator 20 as the basis of calculating the time delay and recording the calculated time delay:

$$\Delta t = \frac{(\text{Reply Time} - \text{Sent Time})}{2}$$

where $\Delta t$ is the Time Delay.

4. Repeating steps 1-3 a number of n times (n is a positive integer), to obtain n values of $\Delta t$.

5. Calculating the synchronization time correction value from the n values of $\Delta t$:

$$t_{sync} = \frac{(\Delta t_0 + \Delta t_1 + \ldots + \Delta t_n)}{n}$$

The synchronization time correction $t_{syn}$, can be used to compensate the problem of time delay with causes the capturing of the current and voltage waveform out of sync, so as to obtain the result similar to actually capturing the waveforms synchronously.

Figure 6:
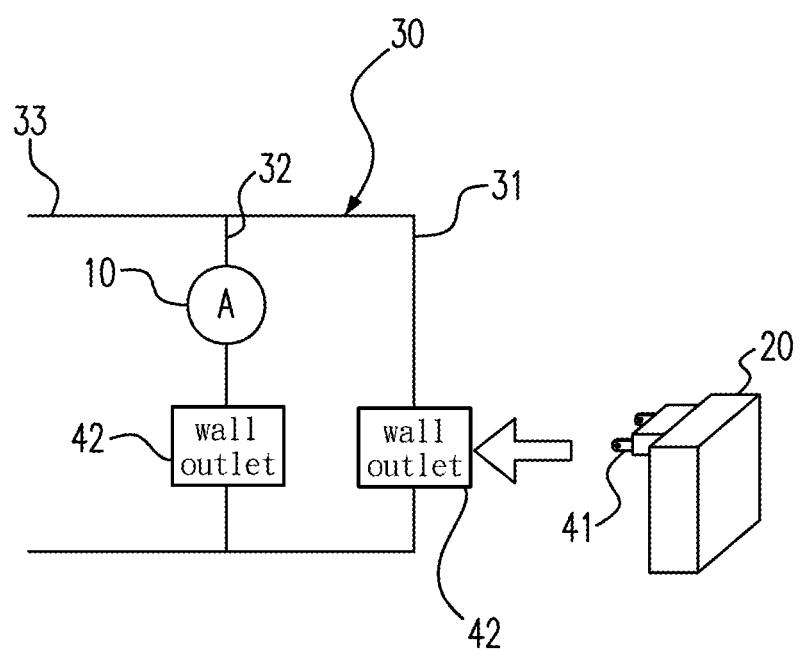
FIG. 6 is a block diagram illustrating another preferred embodiment of the power measuring device of the present invention.

It is understood by the ordinary skilled in the art of the present invention that the present invention arrangement is not limited to the embodiment shown in FIG. 1; rather, the arrangement may be changed as needed. Referring to FIG. 6, there is shown a block diagram illustrating another preferred embodiment of the power measuring device of the present invention for measuring power consumption of a branch circuit 32 of the electrical circuit 30. The electrical circuit environment is similar to that shown in FIG. 1. In order to measure the power consumption data of branch circuit 32, the induced current meter 10 is installed at the branch circuit 32 to measure a first electrical characteristic (such as current data) of the branch circuit 32. Since the wall outlets shown in FIG. 6 are all in parallel (such as in a household electrical circuit), the power consumption indicator 20 can be plugged in to any one of the wall outlet to measure a second electrical characteristic (such as voltage data) of the branch circuit 32. Therefore the arrangement shown in FIG. 6 can be used to measure power consumption of the branch circuit 32 of the electrical circuit 30.

Figure 7:
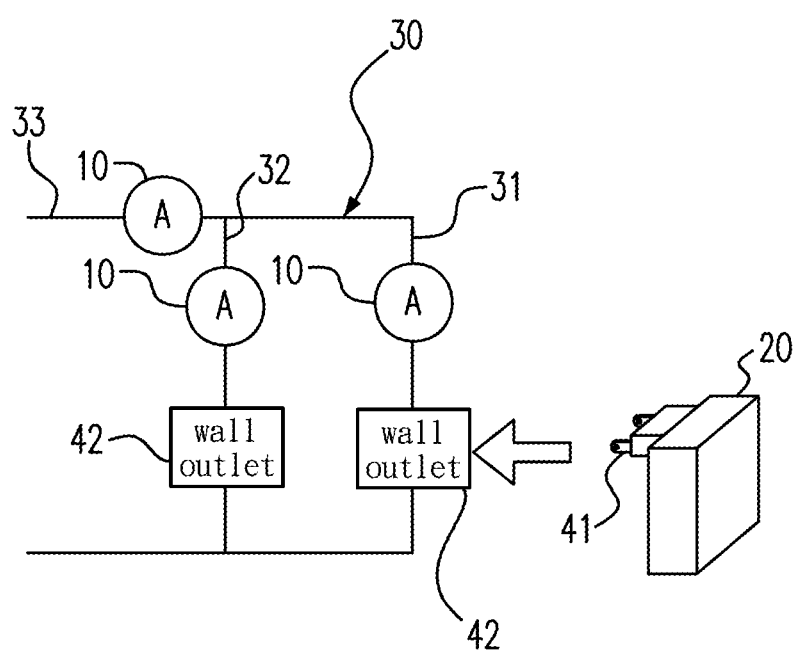
FIG. 7 is a block diagram illustrating still another preferred embodiment of the power measuring device of the present invention.

In addition, as shown in FIG. 7, a user can install induced current meters 10 separately in the main circuit 33 and the branch circuits 31, 32 of the electrical circuit 30, while the power consumption indicator 20 can not only measure an electrical characteristic or voltage data but also select one of the three induced current meters 10 shown in FIG. 7 according a predetermined sequence utilizing a time-division multiplexing (TDM) technique, to sequentially start the induced current meters 10 for measuring electrical properties or current data of the main circuit 33 and the branch circuits 31, 32 to provide the basis for calculating power consumption data and also checking the operating status of the main circuit 33 and the branch circuits 31, 32. For example, failure to measure a current data from a circuit indicates that the circuit may be open.

It is understood by the ordinary skilled in the art of the present invention that in any of the preferred embodiments described above, the voltage data measured by the power consumption indicator 20 can also be transmitted to the induced current meter 10, so the power consumption data can be calculated by the MCU 132 of the induced current meter 10. Alternatively the voltage and current data may be transmitted to a unit such as a computing display unit which performs data integration and computation and displays power consumption information. Furthermore, the power consumption data calculated by any of the units in any of the embodiments described above may be forwarded to a user terminal via email or short message service (SMS).

Although examples of the preferred embodiments of the present invention system and method are shown and described in detail above, the present invention is not limited to the specifics described herein. It will be apparent to those skilled in the art that various modification and variations can be made in the system and method of the present invention without departing from the spirit or scope of the invention. Thus, it is intended that the present invention cover modifications and variations that come within the scope of the appended claims and their equivalents.

What is claimed is:

1. A power measuring device for an electrical circuit that includes a main circuit and multiple parallel branch circuits where the main circuit is electrically connected to the multiple parallel branch circuit, the power measuring device comprising:
    an induced current meter installed at one of the multiple branch circuit or the main circuit for measuring a first current data of said one of the multiple branch circuit or a second current data of the main circuit, and outputting the first or second current data;
    a power consumption indicator electrically connected in parallel with said one or another one of the multiple branch circuits for measuring a voltage data of said one or said other one of the multiple branch circuits, communicating with the induced current meter to receive the first or second current data, calculating a first power consumption data based on the first current data and the voltage data or a second power consumption data based on the second current data and the voltage data, and displaying the first or second power consumption data; and
    whereas the induced current meter and the power consumption indicator are installed separately, and synchronously begin measuring the first current data and the voltage data or synchronously begin measuring the second current data and the voltage data.

2. The device of claim 1, wherein the induced current meter and the power consumption indicator perform a synchronization and correction procedure such that the induced current meter and the power consumption indicator synchronously begin measuring the first current data and the voltage data or synchronously begin measuring the second current data and the voltage data.

3. The device of claim 2, wherein:
    the power consumption indicator transmits a correction signal to the induced current meter;
    the induced current meter transmits a confirmation signal to the power consumption indicator after receiving the correction signal; and
    the power consumption indicator calculates a signal delay time based on the time difference between the time of transmitting the correction signal and the time of receiving the confirmation signal by the power consumption indicator for performing the synchronization and correction procedure.

4. The device of claim 3, wherein the induced current meter comprises:
    a first communication module for transmitting the first or second current data to the power consumption indicator, receiving the correction signal and transmitting the confirmation signal to the power consumption indicator; and a first micro controller unit (MCU) electrically connected to the first communication module for controlling the first communication module.

5. The device of claim 4, wherein the induced current meter further comprises at least one induction coil electrically connected to the first micro controller unit for obtaining the first or second current data through induction, and producing an induced current which is used as a power source of the incurred current meter.

6. The device of claim 4, wherein the power consumption indicator comprises:
    a second communication module for receiving the first or second current data, transmitting the correction signal to and receiving the confirmation signal from the induced current meter; and
    a second micro controller unit (MCU) electrically connected to the second communication module for controlling the second communication module, calculating a signal delay time between the time of transmitting the correction signal and the time of receiving the confirmation signal for performing the synchronization and correction procedure, and calculating the first power consumption data based on the first current data and the voltage data or the second power consumption data based on the second current data and the voltage data, wherein the first or second power consumption data includes at least one of an instant power value, an active power value, a phase of current value, a current value, a voltage value or any combination thereof.

7. The device of claim 6, wherein the first and second communication modules support at least one of wireless communication protocol for Bluetooth, ZigBee or IEEE 802.11 series or any combination thereof.

8. The device of claim 1, wherein the power consumption indicator has a plug to be plugged into a socket of said one or said other one branch circuit such that the power consumption indicator is electrically connected in parallel to said one or said other one of the branch circuits.

9. The device of claim 1, wherein the induced current meter is a clip-on or clamp-on type current meter.

10. The device of claim 1, wherein the induced current meter further comprises a rechargeable battery as a power source of the induced current meter.

11. A power measuring device, comprising:
    a first electrical characteristic measuring unit installed at a branch circuit or a main circuit upstream to the branch circuit for measuring a first electrical characteristic data of the branch circuit or one circuit of the main circuit, and outputting the first electrical characteristic data;
    a second electrical characteristic measuring unit installed on a socket which is electrically connected in parallel to the branch circuit for measuring a second electrical characteristic data of the branch circuit, communicating with the first electrical characteristic measuring unit to receive the first electrical characteristic data for calculating a power consumption data;
    wherein the first and second electrical characteristic measuring units are installed separately, and synchronously begin measuring the first electrical characteristic data and the second electrical characteristic data.

12. The device of claim 11, wherein the first and second electrical characteristic measuring units perform a synchronization and correction procedure such that the first and second electrical characteristic units synchronously begin measuring the first and second electrical characteristic data.

13. The device of claim 12, wherein:
- the second electrical characteristic measuring unit transmits a correction signal to the first electrical characteristic measuring unit;
- the first electrical characteristic measuring unit transmits a confirmation signal to the second electrical characteristic measuring unit after receiving the correction signal; and
- the second electrical characteristic measuring unit calculates a signal delay time based on the time difference between the time of transmitting the correction signal and the time of receiving the confirmation signal by the second electrical characteristic for performing the synchronization and correction procedure.

14. The device of claim 13, wherein the first electrical characteristic measuring unit comprises:
- a first communication module for transmitting the first or second current data to the second electrical characteristic measuring unit, receiving the correction signal from and transmitting the confirmation signal to the second electrical characteristic measuring unit; and
- a first micro controller unit electrically connected to the first communication module for controlling the first communication module.

15. The device of claim 14, wherein the first electrical characteristic measuring unit further comprises at least one induction coil electrically connected to the first micro controller unit for obtaining the first electrical characteristic data through induction, and producing an induced current which is used as a power source of the first electrical characteristic measuring unit.

16. The device of claim 14, wherein the second electrical characteristic measuring unit comprises:
- a second communication module for receiving the first electrical characteristic data, transmitting the correction signal and receiving the confirmation signal; and
- a second micro controller unit (MCU) electrically connected to the second communication module for controlling the second communication module, calculating a signal delay time between the time of transmitting the correction signal and the time of receiving the confirmation signal for performing the synchronization and correction procedure, and calculating the power consumption data based on the first and second electrical characteristic data, wherein the power consumption data includes at least one of an instant power value, an active power value, a phase of current value, a current value, a voltage value or any combination thereof.

17. The device of claim 16, wherein the first and second communication modules support at least one of wireless communication protocol for Bluetooth, ZigBee or IEEE 802.11 series or any combination thereof.

18. The device of claim 11, wherein the second electrical characteristic measuring unit has a plug to be plugged into the socket such that the second electrical characteristic measuring unit is electrically connected in parallel to the branch circuit.

19. The device of claim 11, wherein the first electrical characteristic measuring unit is a clip-on or clamp-on type current meter.

20. The device of claim 11, wherein the first electrical characteristic measuring unit further comprises a rechargeable battery as a power source of the first electrical characteristic measuring unit.

* * * * *